United States Patent
Yoon et al.

(10) Patent No.: US 7,802,361 B2
(45) Date of Patent: Sep. 28, 2010

(54) METHOD FOR MANUFACTURING THE BGA PACKAGE BOARD

(75) Inventors: Kyoung-Ro Yoon, Daejeon (KR);
Young-Hwan Shin, Daejeon (KR);
Tae-Gon Lee, Kyunggi-do (KR)

(73) Assignee: Samsung Electro-Mechanics Co., Ltd, Kyunggi-Do (KR)

( * ) Notice: Subject to any disclaimer, the term of this patent is extended or adjusted under 35 U.S.C. 154(b) by 259 days.

(21) Appl. No.: 12/125,979

(22) Filed: May 23, 2008

(65) Prior Publication Data

US 2008/0216314 A1 Sep. 11, 2008

Related U.S. Application Data

(62) Division of application No. 10/969,403, filed on Oct. 20, 2004, now Pat. No. 7,408,261.

(30) Foreign Application Priority Data

Jul. 26, 2004 (KR) ............................... 2004-58313

(51) Int. Cl.
*H01K 3/10* (2006.01)
*H01B 13/00* (2006.01)
(52) U.S. Cl. .............................. 29/852; 29/831; 29/832; 29/835; 29/842; 29/846; 216/18
(58) Field of Classification Search .................. 29/852, 29/830, 831, 832, 842, 846, 835; 216/18; 174/260, 266; 427/96, 97; 257/737, 700, 257/697, 693, 702, 703
See application file for complete search history.

(56) References Cited

U.S. PATENT DOCUMENTS

| | | | | | |
|---|---|---|---|---|---|
| 5,153,987 | A | * | 10/1992 | Takahashi et al. | 29/852 |
| 5,698,470 | A | * | 12/1997 | Yamaguchi | 216/20 |
| 5,879,568 | A | * | 3/1999 | Urasaki et al. | 216/18 |
| 6,613,986 | B1 | * | 9/2003 | Hirose et al. | 174/255 |
| 2001/0008309 | A1 | * | 7/2001 | Iijima et al. | 257/737 |

* cited by examiner

*Primary Examiner*—Derris H Banks
*Assistant Examiner*—Tai Nguyen
(74) *Attorney, Agent, or Firm*—Gottlieb, Rackman & Reisman, P.C.

(57) ABSTRACT

Disclosed herein is a Ball Grid Array (BGA) package board. The BGA package board includes a first external layer on which a pattern comprising a circuit pattern and a wire bonding pad pattern is formed, a second external layer on which a pattern comprising a circuit pattern and a solder ball pad pattern is formed, an insulating layer formed between the first and second external layers, a first outer via hole to electrically connect the first and second external layers to each other, and a solder resist layer formed on each of the first and second external layers, with portions of the solder resist layer corresponding to the wire bonding pad pattern and the solder ball pad pattern being opened. The solder ball pad pattern is thinner than the circuit pattern of the second external layer.

17 Claims, 9 Drawing Sheets

METHOD FOR MANUFACTURING THE BGA PACKAGE BOARD

This application is a Divisional of U.S. Ser. No. 10/969,403 filed Oct. 20, 2004, which issued on Aug. 5, 2008 as U.S. Pat. No. 7,408,261, the content of which is incorporated herein by reference.

BACKGROUND OF THE INVENTION

1. Field of the Invention

The present invention relates generally to a BGA (Ball Grid Array) package board and a manufacturing method thereof, and more particularly, to a BGA package board and a manufacturing method thereof, capable of preventing solder balls from adhering to each other by adjusting the thickness of a solder ball pad.

2. Description of the Related Art

Recently, as miniaturization and higher integration of multi-functional electronic devices are achieved, BGA package board technology has been rapidly developed to realize lightness, thinness, shortness, and smallness and a fine circuit pattern of a high density. Particularly, the lightness, thinness, shortness, and smallness and the fine circuit pattern have been increasingly required for a CSP (Chip-Sized Package) with a semiconductor chip mounted on the BGA package board.

Figure 1A:
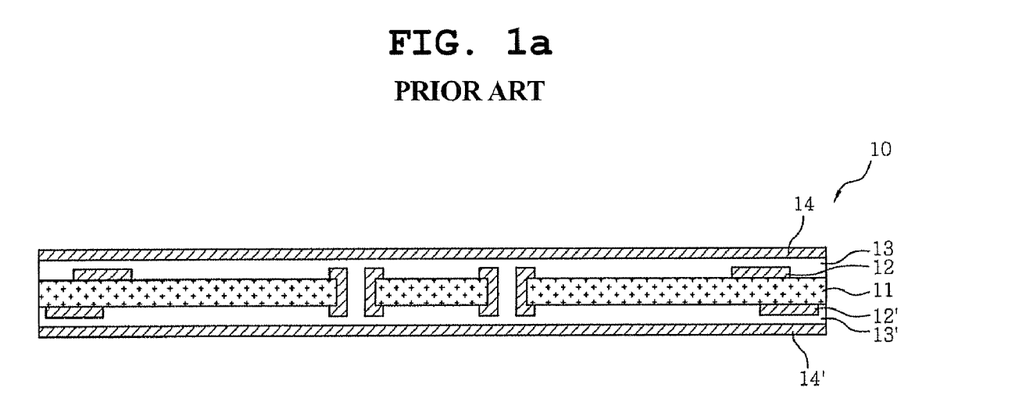
FIG. 1a to 1k are sectional views to show a method for manufacturing a conventional BGA package board.
Figure 1B:
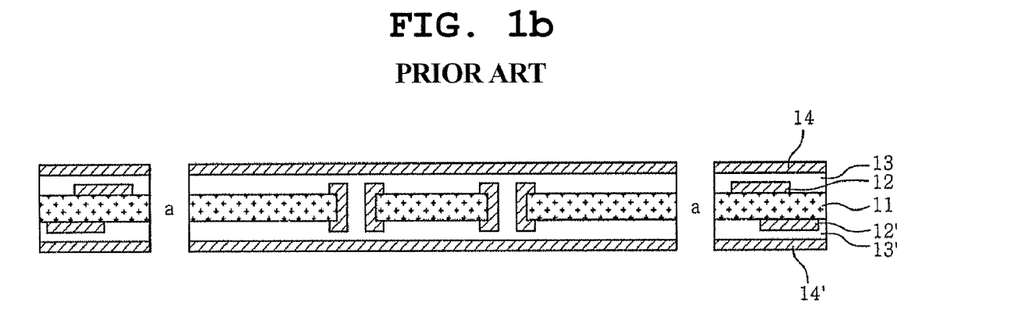
Figure 1C:
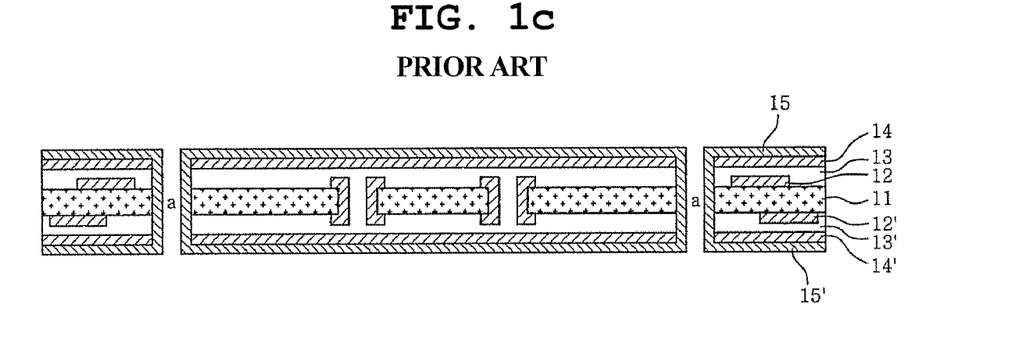
Figure 1D:
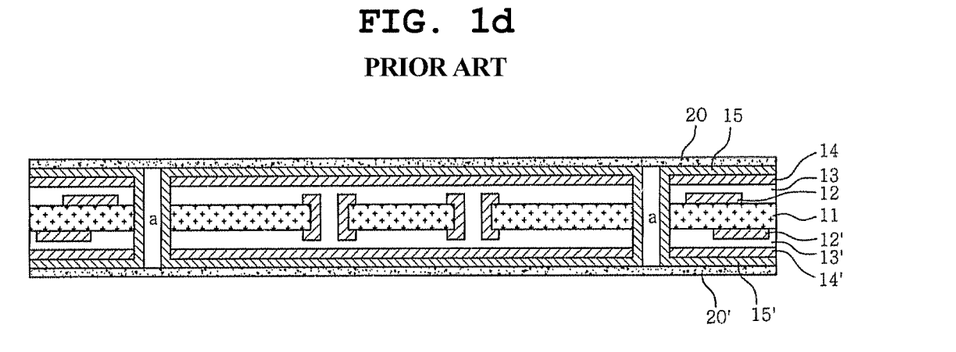
Figure 1E:
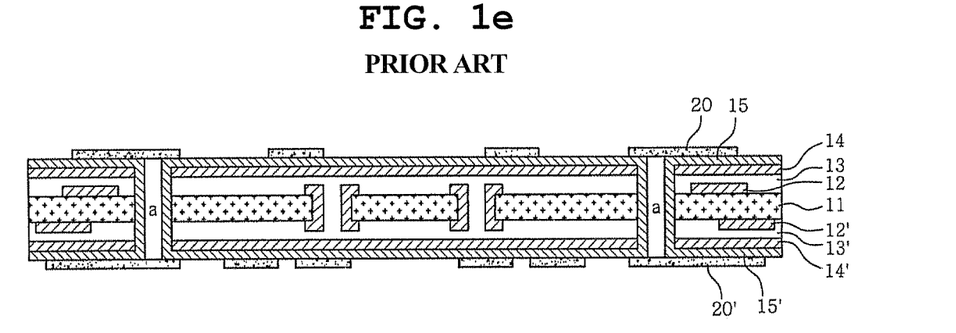
Figure 1F:
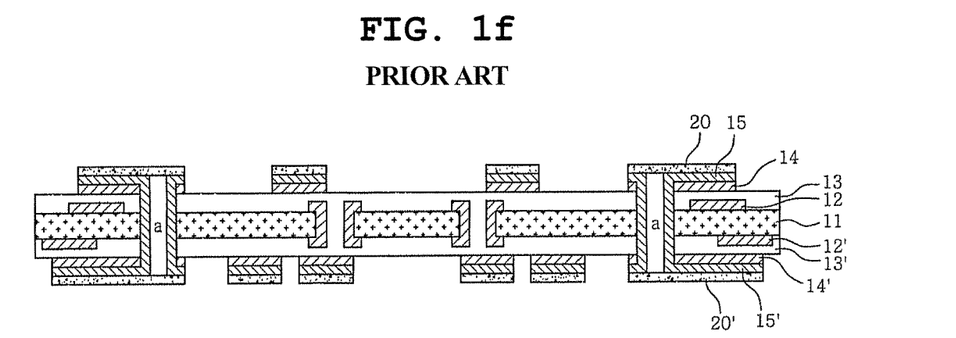
Figure 1G:
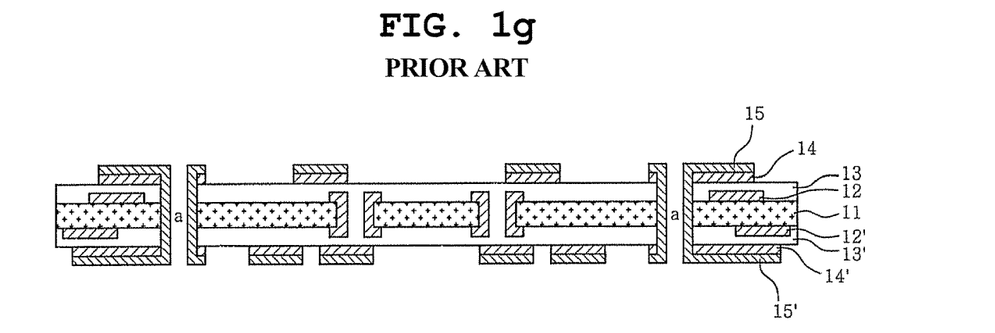
Figure 1H:
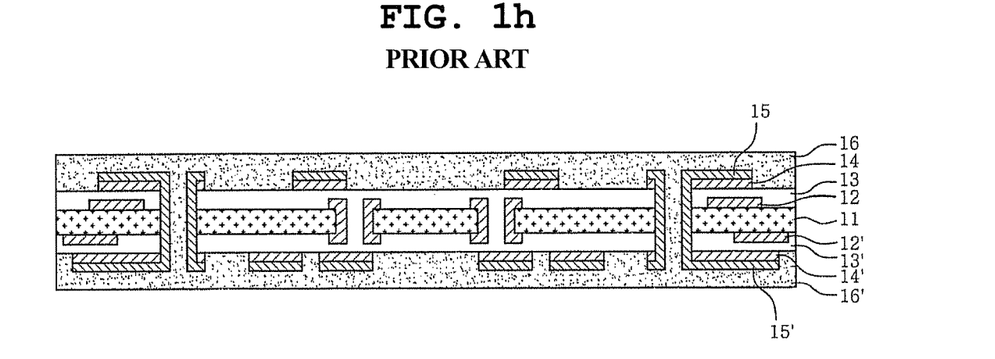
Figure 1I:
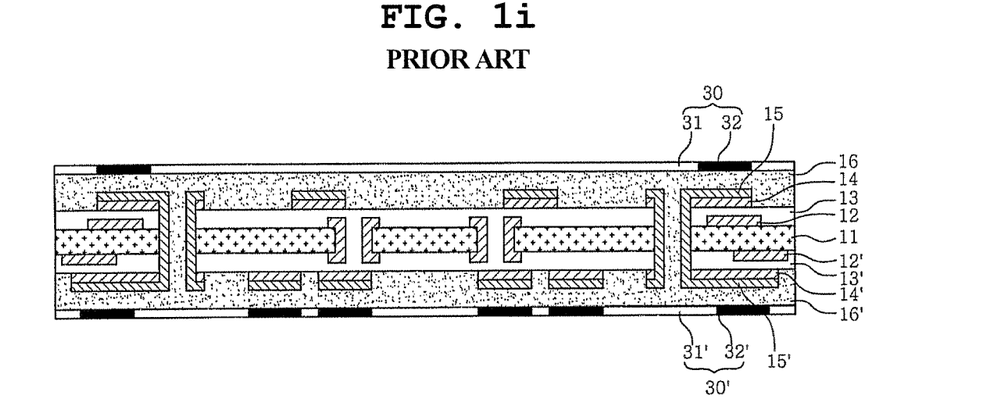
Figure 1J:
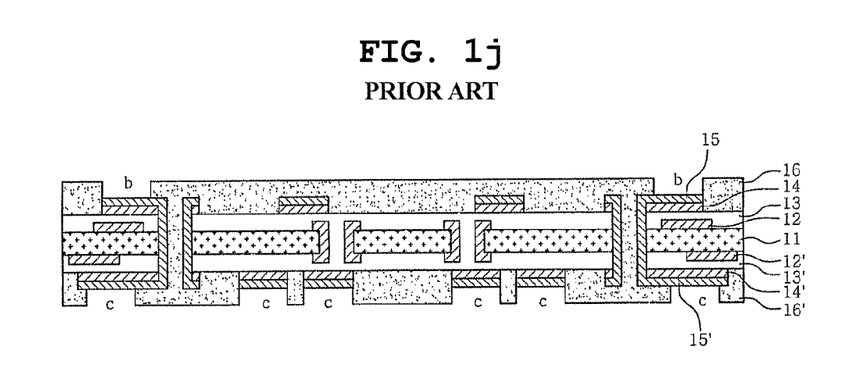
Figure 1K:
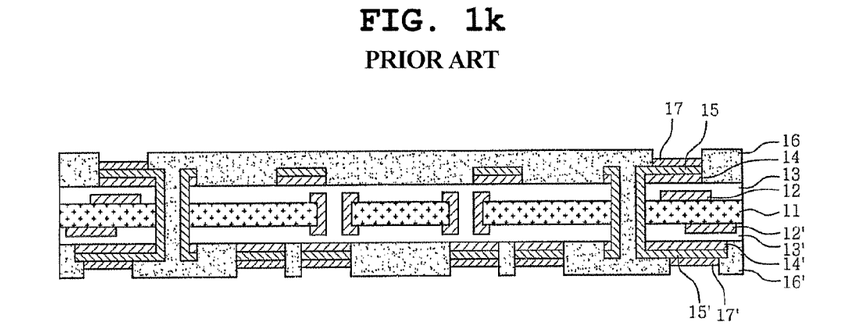
Figure 2:
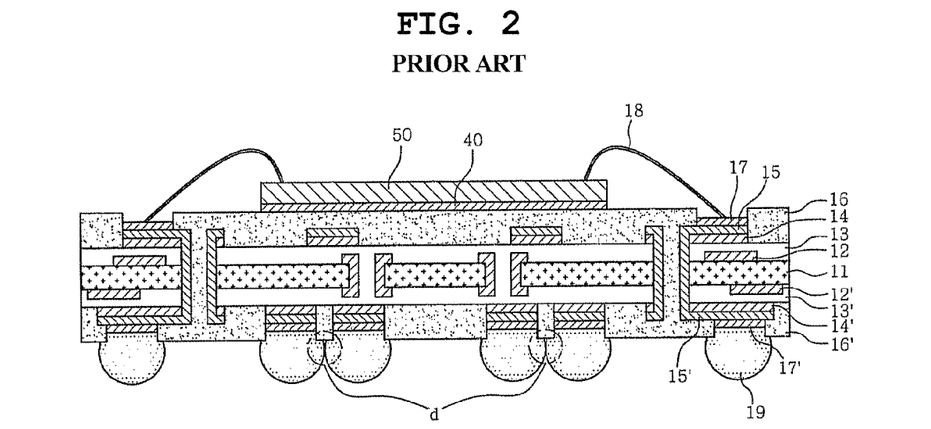
FIG. 2 is a sectional view of a CSP with a semiconductor chip mounted on the BGA package board manufactured through the method of FIGS. 1a to 1k.

FIG. 1a to 1k are sectional views to show a method for manufacturing a conventional BGA package board, and FIG. 2 is a sectional view of a CSP with a semiconductor chip mounted on the BGA package board manufactured through the method of FIGS. 1a to 1k.

As shown in FIG. 1a, a base plate 10 is prepared, which is constructed as follows. The base plate 10 includes a copper clad laminate having an insulating resin layer 11 and copper foil layers 12 and 12' on which circuit patterns are formed. Prepregs 13, 13' and copper foils 14, 14' are laminated on both surfaces of the copper clad laminate.

As shown in FIG. 1b, via holes a are formed to connect circuits of the upper and lower copper foils 14 and 14' provided on the base plate 10.

As shown in FIG. 1c, copper plating layers 15 and 15' are formed on the upper and lower copper foils 14 and 14' and sidewalls of the via holes a to electrically connect the via holes a.

As shown in FIG. 1d, dry films 20 and 20' are coated on the upper and lower copper plating layers 15 and 15' of the base plate 10.

As shown in FIG. 1e, the dry films 20 and 20' are exposed and developed using art work films (not shown) on which predetermined patterns are printed, so that the predetermined patterns are formed on the dry films 20 and 20'. In this case, the pattern comprises a circuit pattern, a land of each via hole a, a wire bonding pad pattern, and a solder ball pad pattern.

As shown in FIG. 1f, the dry films 20 and 20' each having a predetermined pattern are used as an etching resist, and the base plate 10 is submerged in etchant. Thus, the upper and lower copper films 14 and 14' and the copper plating layers 15 and 15' are etched and removed, except for parts corresponding to the patterns of the dry films 20 and 20'.

As shown in FIG. 1g, the dry films 20 and 20' coated on the upper and lower surfaces of the base plate 10 are stripped.

As shown in FIG. 1h, solder resists 16 and 16' are coated on the base plate 10, and then dried.

As shown in FIG. 1i, art work films 30 and 30' on which solder resist patterns are printed come into close contact with the upper and lower solder resists 16 and 16' of the base plate 10. Next, the solder resists 16 and 16' are exposed and developed, thus curing the solder resists 16 and 16' to correspond to the solder resist patterns. In this case, during the exposure process, ultraviolet rays do not penetrate black parts 32 and 32' on which the solder resist patterns of the art work films 30 and 30' are printed. Conversely, ultraviolet rays penetrate non-printed parts 31 and 31', thus curing the solder resists 16 and 16'.

As shown in FIG. 1j, after removing the art work films 30 and 30', non-cured parts of the solder resists 16 and 16' are removed. Thereby, the solder resist patterns are formed.

As shown in FIG. 1k, gold plating layers 17 are formed on openings b having the pattern of the upper solder resist 16 of the base plate 10, that is, wire bonding pads. Further, gold plating layers 17' are formed on openings c having the pattern of the lower solder resist 16', that is, solder ball pads.

Subsequently, a semiconductor chip 50 is mounted on the board by an adhesive 40, and bonded wires 18 and solder balls 19 are formed. Through the above-mentioned process, a CSP is completed, as shown in FIG. 2.

The method of manufacturing the BGA package board is disclosed in Korean Pat. No. 344,618, which was filed by the applicant of this invention on Nov. 14, 1995.

Now, a pitch between the solder balls 19 of the BGA package board used in the CSP has been gradually reduced (0.8 mm→0.65 mm→0.5 mm→0.4 mm or less).

When the pitch between the solder balls 19 is 0.65 mm or higher, the conventional BGA package board manufactured through the above-mentioned method may be used to manufacture the CSP without any difficulty.

However, when the pitch between the solder balls 19 is 0.5 mm or less, neighboring solder balls 19 may be undesirably adhered to each other (see the circles d defined with dotted lines in FIG. 2).

Particularly, such adhesion of the solder balls 19 may occur more frequently when the BGA package board is mounted on a main board, so that a final electronic product may be unreliable.

SUMMARY OF THE INVENTION

Accordingly, the present invention has been made keeping in mind the above problems occurring in the prior art, and an object of the present invention is to provide a BGA board and a manufacturing method thereof, capable of preventing solder balls from adhering to each other.

Another object of the present invention is to provide a BGA board and a manufacturing method thereof, capable of densely arranging solder balls, thus being efficiently adapted to an electronic product which is characterized by miniaturization, high integration, and multi-functionality.

In order to accomplish the above object, the present invention provides a BGA package board, including a first external layer on which a pattern comprising a circuit pattern and a wire bonding pad pattern is formed; a second external layer on which a pattern comprising a circuit pattern and a solder ball pad pattern is formed; an insulating layer formed between the first and second external layers; a first outer via hole to electrically connect the first and second external layers to each other; and a solder resist layer formed on each of the first and second external layers, with portions of the solder resist layer corresponding to the wire bonding pad pattern and the solder ball pad pattern being opened, wherein the solder ball pad pattern is thinner than the circuit pattern of the second external layer.

The BGA package board further includes an internal layer formed in the insulating layer, and having a plurality of circuit layers with a circuit pattern, a plurality of insulating resin layers formed between the circuit layers, and inner via holes to electrically connect the circuit layers to each other; and a second outer via hole to electrically connect the external layers to the circuit layers of the internal layer.

Preferably, the BGA package board further includes a gold plating layer formed on each of the wire bonding pad pattern and the solder ball pad pattern.

Preferably, the BGA package board further includes nickel plating layers formed between the wire bonding pad pattern and the gold plating layer, and between the solder ball pad pattern and the gold plating layer.

Preferably, the BGA package board further includes a solder ball formed on the gold plating layer of the solder ball pad pattern.

In order to accomplish the above object, the present invention provides a method of manufacturing the BGA package board, including (A) providing a base plate including a first external layer, a second external layer, and an insulating layer provided between the first and second external layers; (B) forming a pattern including a circuit pattern and a wire bonding pattern on the first external layer, and forming a pattern including a circuit pattern and a solder ball pad pattern on the second external layer; (C) coating a solder resist on each of the first and second external layers, and forming a solder resist pattern which is opened at portions corresponding to the wire bonding pad pattern and the solder ball pad pattern; and (D) partially etching the solder ball pad pattern of the second external layer.

Preferably, the method further includes (E) forming a first outer via hole on the base plate, after the (A) step of providing the base plate; and (F) forming a copper plating layer on each of the first and second external layers of the base plate and sidewalls of the first outer via hole.

Preferably, the method further includes (E) forming a nickel plating layer on each of the wire bonding pattern and the solder ball pad pattern, after the (D) step of partially etching the solder ball pad pattern of the second external layer; (F) forming a gold plating layer on the nickel plating layer formed on each of the wire bonding pad pattern and the solder ball pad pattern; and (G) forming solder balls on the gold plating layer with the solder ball pad pattern.

Preferably, the (D) step of partially etching the solder ball pad pattern of the second external layer includes (D-1) coating an etching resist on the solder resist of the second external layer, and exposing and developing the etching resist, thus forming an etching resist pattern so that a portion corresponding to the solder ball pad pattern is opened; (D-2) partially etching the solder ball pad pattern, using the etching resist pattern; and (D-3) removing the etching resist.

Preferably, the (D-2) step of partially etching the solder ball pad pattern includes partially etching the solder ball pad pattern using a wet etching method including a spray etching method.

Preferably, the (D-2) step of partially etching the solder ball pad pattern includes partially etching the solder ball pad pattern using a dry etching method including a plasma etching method.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Hereinafter, a Ball Grid Array (BGA) package board and a manufacturing method thereof according to the present invention will be described in detail with reference to the attached drawings.

Figure 3A:
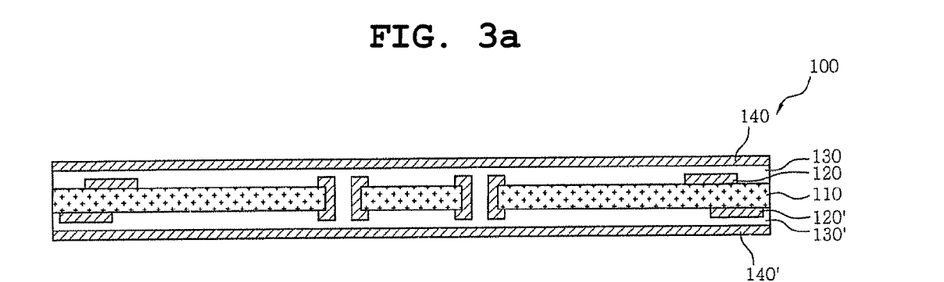
FIGS. 3a to 3o are sectional views to show a method for manufacturing a BGA package board, according to an embodiment of the present invention.
Figure 3B:
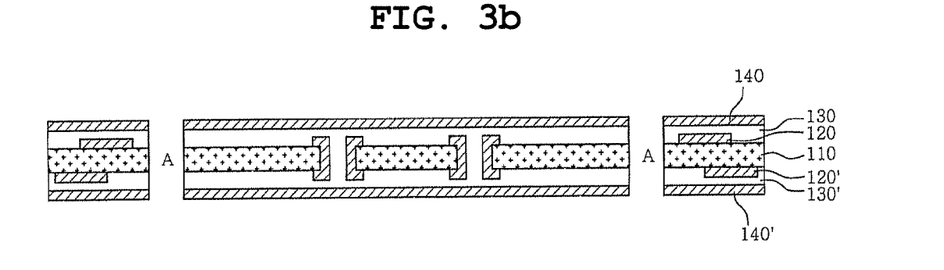
Figure 3C:
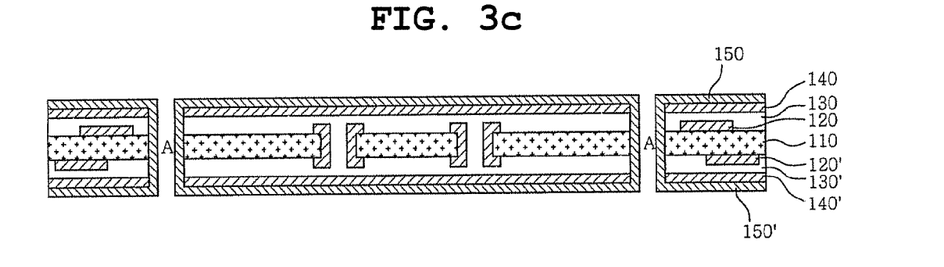
Figure 3D:
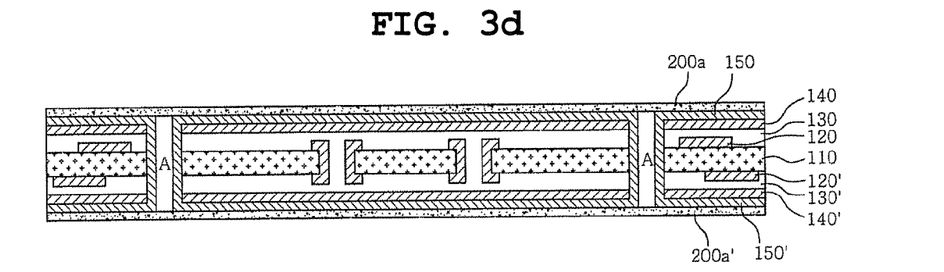
Figure 3E:
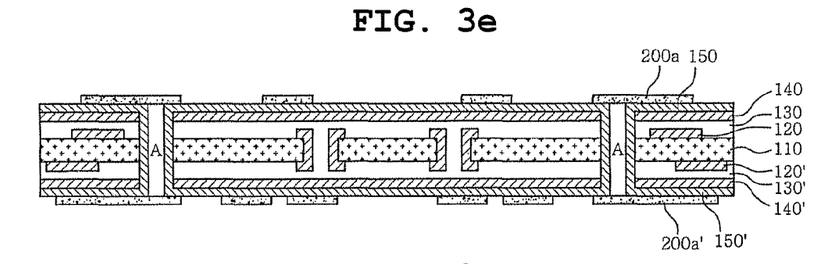
Figure 3F:
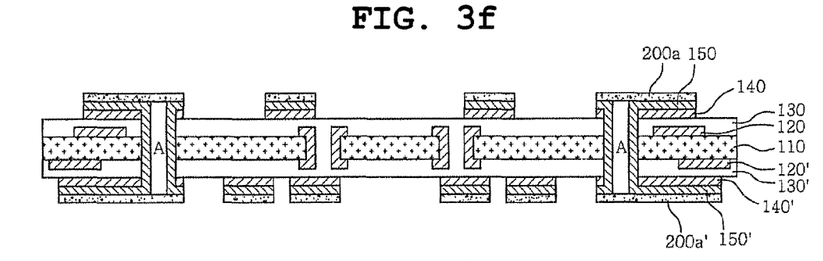
Figure 3G:
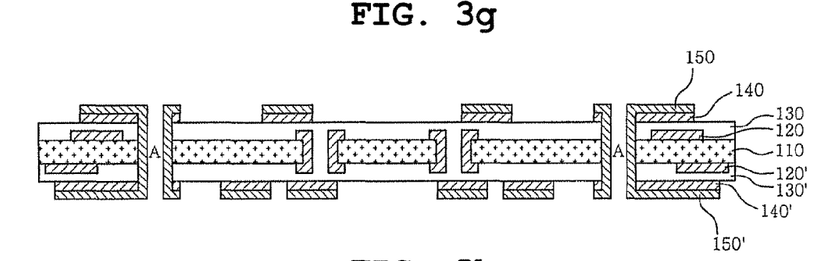
Figure 3H:
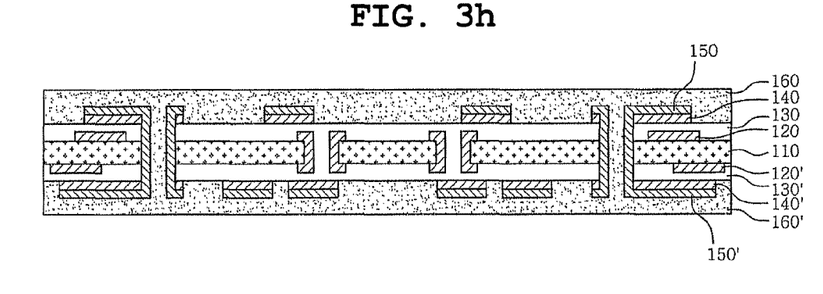
Figure 3I:
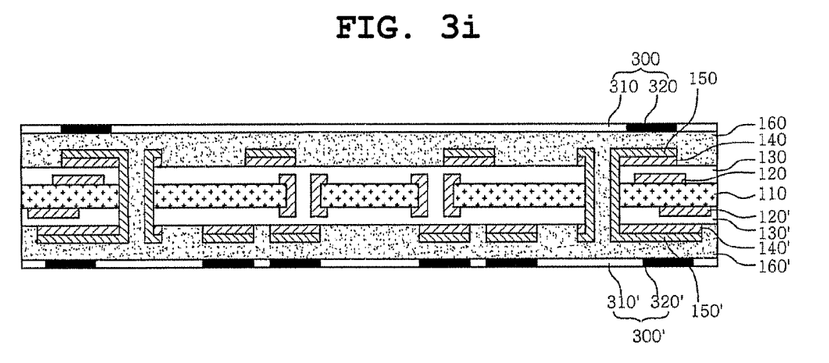
Figure 3J:
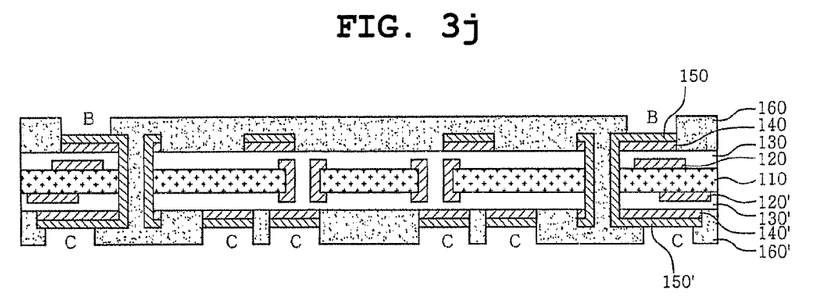
Figure 3K:
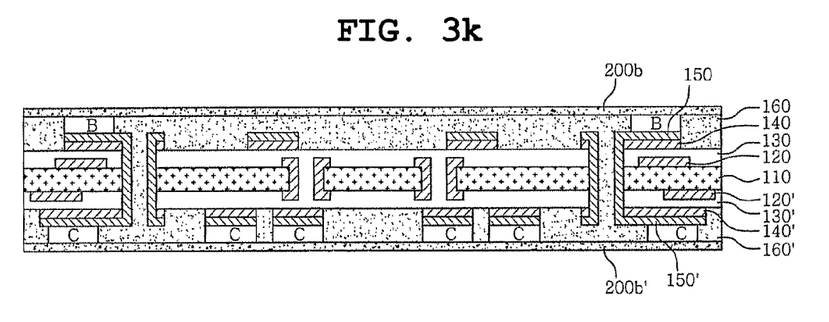
Figure 3L:
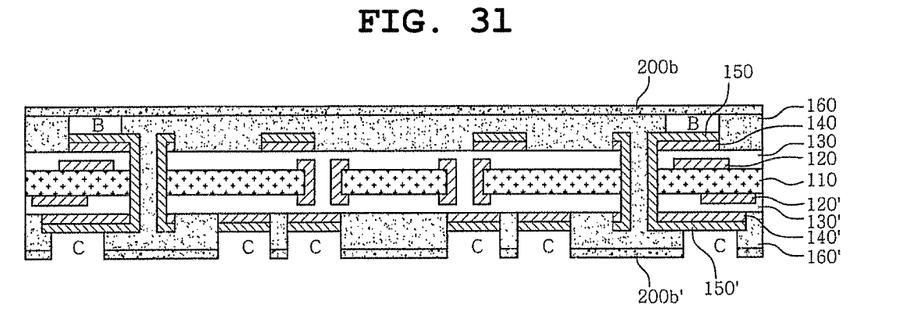
Figure 3M:
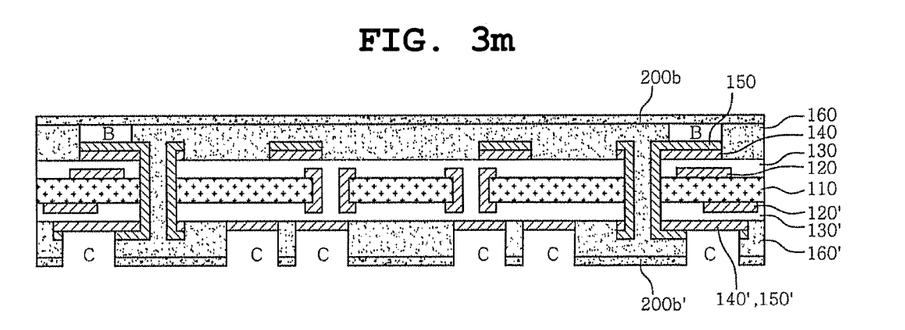
Figure 3N:
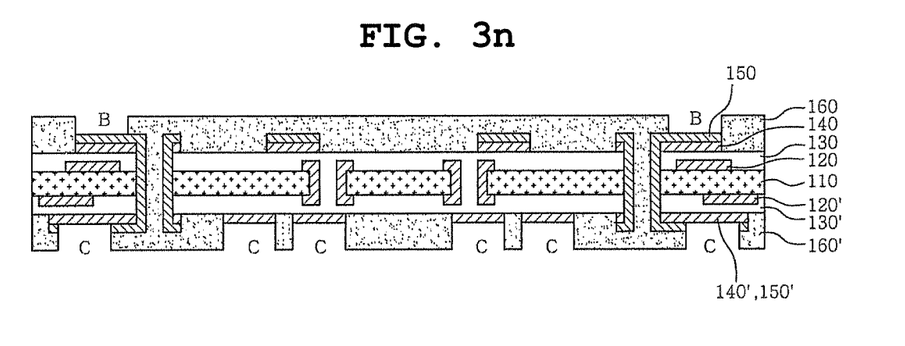
Figure 3O:
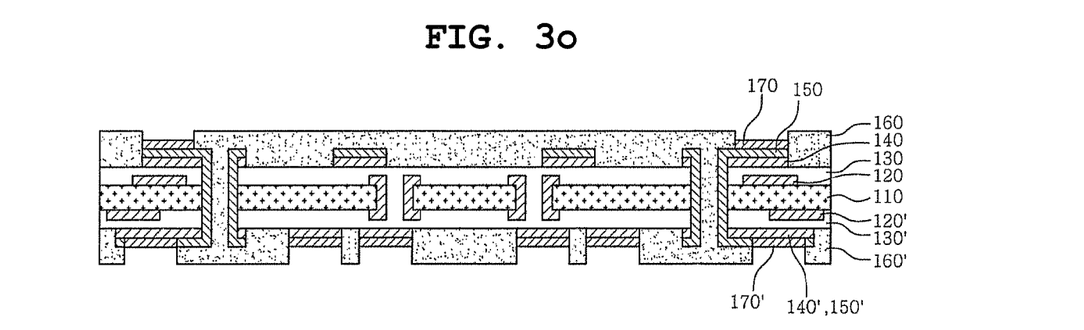
Figure 4:
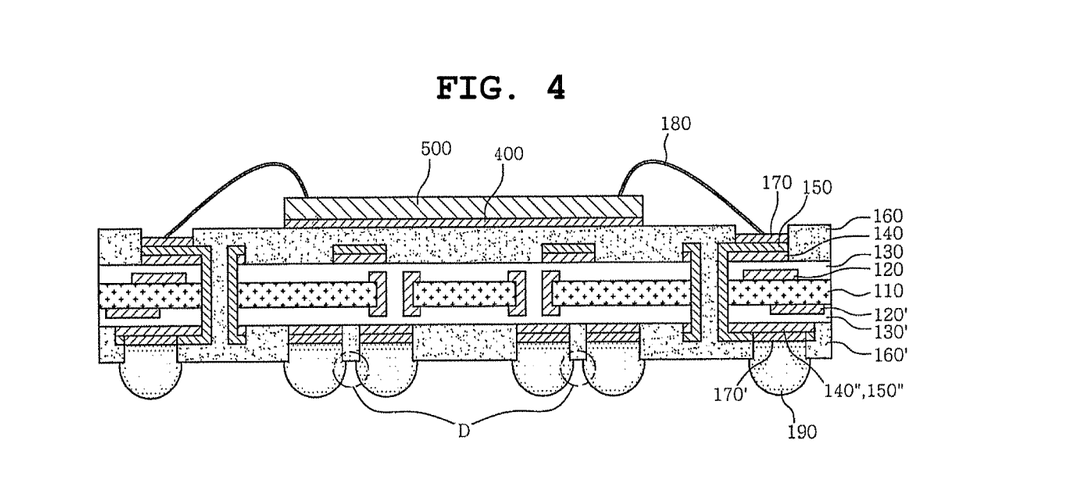
FIG. 4 is a sectional view of a CSP with a semiconductor chip mounted on the BGA package board manufactured through the method of FIGS. 3a to 3o.

FIGS. 3a to 3o are sectional views to show a method for manufacturing a BGA package board, according to an embodiment of the present invention, and FIG. 4 is a sectional view of a CSP (Chip-Sized Package) with a semiconductor chip mounted on the BGA package board manufactured through the method of FIGS. 3a to 3o.

As shown in FIG. 3a, a base plate 100 is prepared, which is constructed as follows. The base plate 100 includes a copper clad laminate having an insulating resin layer 110 and copper foil layers 120 and 120' on which circuit patterns are formed. Further, insulating layers 130 and 130', for example, prepreg, and copper foils 140, 140' are laminated on both surfaces of the copper clad laminate.

In this case, the copper clad laminate used as an internal layer of the base plate 100 may be selected from a group including a glass/epoxy copper clad laminate, a heat-resistant resistance copper clad laminate, a paper/phenol copper clad laminate, a copper clad laminate for a high frequency, a flexible copper clad laminate, a composite copper clad laminate, etc., according to the intended purpose. However, it is preferable that the glass/epoxy copper clad laminate be used to fabricate a printed circuit board. The glass/epoxy copper clad laminate is designed so that the copper foil layers 120 and 120' are coated on the insulating resin layer 110.

According to this embodiment, the internal layer of the base plate 100, that is, the copper foil layers 120 and 120' provided in the base plate 100 and having circuit patterns, has a two-layer structure. However, according to the intended purpose, it is possible to use the base plate 100 whose internal layer has a multi-layer structure, such as a four- or six-layer structure. Further, it is possible to use the base plate 100 having no internal layer, for example, when the copper clad laminate itself is used as the base plate 100.

Further, according to this embodiment, in order to form an external layer, that is, the copper foil layers provided at an outer position of the base plate 100 and having circuit patterns, the insulating layers 130 and 130' and the copper foils 140 and 140' are laminated on both surfaces of the copper clad laminate. However, the external layer may be formed by laminating Resin Coated Copper (RCC) on both surfaces of the copper clad laminate.

As shown in FIG. 3b, in order to connect circuits on the upper and lower copper foils 140 and 140', via holes A are formed.

Preferably, the via holes A are formed at predetermined positions, using a Computer Numerical Control (CNC) drill or a laser drill.

Using the CNC drill is suitable for forming the via holes A on a double-sided printed circuit board or forming through holes on a multilayer printed circuit board. After forming the via holes A or through holes using the CNC drill, it is preferable to perform a deburring process so as to remove burrs from the copper foils 140 and 140', dust from sidewalls of the via holes A, or dust from surfaces of the copper foils 140 and 140', which are produced during the drilling process. The deburring process provides predetermined roughness to surfaces of the copper foils 140 and 140', so that a coupling force with copper is increased during a copper plating process.

The method of using the laser drill is suitable for forming micro via holes on a multilayer printed circuit board. For example, the copper foils 140 and 140' and the insulating layers 130 and 130' may be simultaneously formed using an Yttrium Aluminum Garnet (YAG) laser. Further, after etching predetermined portions of the copper foils 140 and 140' to form the via holes A, the insulating layers 130 and 130' may be processed using a $CO_2$ laser.

After forming the via holes A, it is preferable to perform a desmear process to remove smear. By the heat generated during forming the via holes A, the insulating layers 130 and 130' become molten, thus causing smear on the sidewalls of the via holes A.

As shown in FIG. 3c, in order to electrically connect the via holes A, copper plating layers 150 and 150' are formed on the upper and lower copper foils 140 and 140' of the base plate 100 and the sidewalls of the via holes A.

Since the sidewalls of the via holes A are the insulating resin layer 110 and the insulating layers 130 and 130', it is impossible to perform electrolytic copper plating, right after forming the via holes A.

Therefore, in order to electrically connect the via holes A and perform the electrolytic copper plating, electroless copper plating is carried out. The electroless copper plating is a method of plating an insulator without using a charged ion reaction. Such electroless copper plating is performed by deposition, and the rate of deposition is increased by a catalyst. In order to deposit copper from a plating solution, a catalyst must be attached to a surface of a material to be plated. This means that the electroless copper plating process requires many pre-treatments.

In a detailed description, the electroless copper plating process includes a degreasing step, a soft etching step, a pre-catalyst step, a main catalyst step, an accelerator step, an electroless copper plating step, and an oxidation inhibiting step.

At the degreasing step, oxides and impurities existing on the surfaces of the upper and lower copper foils 140 and 140', especially grease, are removed using chemicals containing an acidic or alkaline surfactant. Thereafter, the surfactant is completely washed off.

At the soft etching step, predetermined roughness (e.g. about 1□~2□) is provided on the surface of each of the upper and lower copper foils 140 and 140', thus allowing copper particles to be uniformly attached to the surface of each of the upper and lower copper foils 140 and 140' at the plating step. Further, contaminants remaining after the degreasing step are eliminated.

At the pre-catalyst step, the base plate 100 is submerged in chemicals containing a small amount of catalyst, thus preventing chemicals used at the main catalyst step from being contaminated or changed in concentration thereof. Moreover, the base plate 100 is submerged in a chemical bath having the same elements beforehand, so that the main catalyst step is more quickly performed. Preferably, the pre-catalyst step uses chemicals containing the catalyst of 1-3%.

At the main catalyst step, the catalyst particles are coated on surfaces of the copper foils 140 and 140', the insulating resin layer 110, and the insulating layers 130 and 130', that is, the sidewalls of the via holes A. It is preferable that a Pd—Sn compound be used as the catalyst particles. The Pd—Sn compound is formed by combining $CU^{2+}$ with $Pd^{2-}$, and plays a role in increasing the rate of the plating.

At the electroless copper plating step, it is preferable that the plating solution consist of $CuSO_4$, HCHO, NaOH, and stabilizers. In order to continue the plating reaction, a chemical reaction must be balanced. It is important to control composition of the plating solution so as to balance the chemical reaction. Further, in order to maintain a desired composition, an appropriate supply of lacking elements, mechanical agitation, and a circulation system of the plating solution must be effectively controlled. Furthermore, a filtering unit is required to filter by-products caused by the reaction. By using the filtering unit, the plating solution can be used for a longer time.

At the oxidation inhibiting step, an anti-oxidation film is coated on a whole surface of the plated film to prevent the plated film from being oxidized due to remaining alkaline elements after the electroless copper plating is performed.

However, the electroless copper plating process exhibits inferior physical properties, compared to the electrolytic copper plating process. Thus, the film obtained through the electroless copper plating process is thin.

After the electroless copper plating process is completed, the base plate 100 is submerged in a copper plating container, and then the electrolytic copper plating is performed using a DC rectifier. Preferably, the electrolytic copper plating is carried out in such a way that an area to be plated is calculated and a proper current is supplied to the DC rectifier to deposit copper.

The electrolytic copper plating process is advantageous in that a copper plating layer obtained through the electrolytic copper plating process exhibits superior physical properties, compared to that obtained through the electroless copper plating process, and it is easier to form a thick copper plating layer.

As shown in FIG. 3d, dry films 200a and 200a' are respectively coated on the upper and lower copper plating layers 150 and 150' of the base plate 100.

In this case, each of the dry films 200a and 200a' has a three-layered structure having a cover film, a photo-resist film, and a Mylar film. The photo-resist film effectively functions as a resist.

As shown in FIG. 3e, each of the dry films 200a and 200a' is exposed and developed using an art work film (not shown) on which a predetermined pattern is printed, so that the predetermined pattern is formed on each of the dry films 200a and 200a'.

In this case, the pattern comprises the circuit pattern, a land of each via hole A, a wire bonding pad pattern, and a solder ball pad pattern.

The exposing and developing processes of the dry films 200a and 200a' are performed as follows. That is, the art work film on which the predetermined pattern is printed comes into close contact with each of the dry films 200a and 200a', and then the art work films are irradiated with ultraviolet rays. At this time, the ultraviolet rays do not penetrate black parts of the art work films on which the patterns are printed, whereas the ultraviolet rays penetrate non-printed parts of the art work films, thus curing the dry films 200a and 200a' under the art work films. Next, the base plate 100 having the dry films 200a and 200a' cured is submerged in a developing solution. At this time, non-cured parts of the dry films 200a and 200a' are removed by the developing solution, and only the cured parts of the dry films 200a and 200a' remain, thus forming an etching resist pattern. In this case, sodium carbonate ($Na_2CO_3$) solution or potassium carbonate ($K_2CO_3$) solution may be used as the developing solution.

As shown in FIG. 3f, the dry films 200a and 200a' each having a predetermined pattern are used as etching resist, and etchant is sprayed onto the base plate 100. Thus, the upper and lower copper films 140 and 140' and the copper plating layers 150 and 150' are etched and removed, except for parts corresponding to the patterns of the dry films 200a and 200a'.

As shown in FIG. 3g, the dry films 200a and 200a' coated on the upper and lower surfaces of the base plate 100 are stripped.

In this case, the dry films 200a and 200a' are stripped using a stripping solution containing sodium hydrate (NaOH) or potassium hydroxide (KOH).

At the steps shown in FIGS. 3d to 3g, the dry films 200a and 200a' are used as the etching resist, but a liquid photo resist may be used as the etching resist.

In this case, the liquid photo resist which resists ultraviolet rays is coated on the copper plating layers 150 and 150', and then dried. Subsequently, the photo resist is exposed and developed using the art work film having a predetermined pattern, so that the predetermined pattern is formed on the photo resist. Next, the photo resist having the predetermined pattern is used as the etching resist, and the etchant is sprayed onto the base plate 100. Thus, the upper and lower copper films 140 and 140' and the copper plating layers 150 and 150' are etched and removed, except for parts corresponding to the predetermined pattern of the photo resist. Thereafter, the photo resist is removed. In this case, the liquid photo resist may be coated through various coating methods, including a dip coating method, a roll coating method, an electro-deposition method, etc.

The method of using the liquid photo resist is advantageous in that the liquid photo resist can be thinly coated, compared to the dry films 200a and 200a', thus achieving a fine circuit pattern. Further, when the surface of the base plate 100 is uneven, the liquid photo resist fills depressed parts, thus providing an even surface.

As shown in FIG. 3h, solder resists 160 and 160' are coated on the base plate 100, and then dried.

When a fingerprint is left on, or grease or dust covers the base plate 100 having the copper foils 140 and 140' and the copper plating layers 150 and 150' on which the circuit patterns are formed, at the following step, the solder resists 160 and 160' may not be in close contact with the base plate 100. Therefore, prior to coating the solder resists 160 and 160', a preliminary treatment is required to wash the surface of the base plate and provide predetermined roughness to the surface, thus allowing the solder resists 160 and 160' to come into close contact with the base plate 100.

The solder resists 160 and 160' may be coated through following methods, including a screen printing method, a roller coating method, a curtain coating method, a spray coating method, etc.

As shown in FIG. 3i, art work films 300 and 300' having solder resist patterns come into close contact with the upper and lower solder resists 160 and 160' of the base plate 100. Thereafter, the solder resists 160 and 160' are exposed and developed, thus being cured to correspond to the solder resist patterns.

In this case, during the exposure process, ultraviolet rays do not penetrate black parts 320 and 320' having the solder resist patterns of the art work films 300 and 300', but ultraviolet rays penetrate non-printed parts 310 and 310' to cure the solder resists 160 and 160'.

As shown in FIG. 3j, the art work films 300 and 300' are removed, and the non-cured parts of the solder resists 160 and 160' are removed during the developing process, thus forming the solder resist patterns. Subsequently, ultraviolet rays are irradiated, and the solder resists 160 and 160' are completely cured using a dryer (not shown).

In this case, in order to eliminate residues and impurities remaining on the base plate 100 after removing predetermined parts of the solder resists 160, it is preferable to further perform a process for eliminating the residues and impurities, using plasma and the like.

As shown in FIG. 3k, other dry films 200b and 200b' are coated on the upper and lower solder resists 160 and 160' of the base plate 100.

As shown in FIG. 3l, the dry films 200b and 200b' are exposed and developed, using art work films (not shown) having patterns corresponding to the solder ball pads, so that the patterns corresponding to the solder ball pads are formed on the dry films 200b and 200b'.

As shown in FIG. 3m, the dry films 200b and 200b' are used as etching resists, and etchant is sprayed onto the base plate 100. Thus, the copper foil 140' or the copper plating layer 150' of the solder ball pads is removed through a partial etching process.

Through the partial etching process, a thickness of the copper foil 140' or the copper plating layer 150' of the solder ball pads is less than that of the copper foil 140' or the copper plating layer 150', which is provided on the same layer and has the circuit pattern.

According to an embodiment, the solder ball pads in which the copper plating layer 150 is etched are shown. However, a solder ball pad in which only the copper plating layer 150' is partially etched may be formed. Further, a solder ball pad in which the copper plating layer 150' is completely etched and the copper foil 140' is partially etched may be formed.

According to another embodiment, it is possible to etch the copper plating layer 150' of the solder ball pads or the copper foil 140' through a directional partial etching process using plasma.

The thickness of the copper foil 140' or the copper plating layer 150' that form the solder ball pads is determined according to electrical characteristics or a size of a solder ball formed at a following step.

As shown in FIG. 3n, the dry films 200b and 200b', which are coated on the upper and lower surfaces of the base plate 100, are stripped.

At the steps shown in FIGS. 3k to 3n, the dry films 200b and 200b' are used as the etching resist. However, the liquid photo resist may be used as the etching resist, as shown in FIG. 3d to 3g.

The process of using the liquid photo resist will be described below. The liquid photo resist which resists the ultraviolet rays is coated on the copper plating layers 150 and 150' of the base plate 100, and then dried. Next, the photo resist is exposed and developed using the art work film having a predetermined pattern, so that the predetermined pattern is formed on the photo resist. Subsequently, the photo resist having the predetermined pattern is used as the etching resist, and the etchant is sprayed onto the base plate 100. Thus, the copper foil 140' or the copper plating layer 150' is etched and removed, except for parts corresponding to the predetermined pattern of the photo resist. Thereafter, the photo resist is removed. In this case, the liquid photo resist may be coated through various coating methods, including a dip coating method, a roll coating method, an electro-deposition method, etc.

As shown in FIG. 3o, gold plating layers 170 are formed in openings B having the patterns of the upper solder resist 160 of the base plate 100, that is, the wire bonding pads. Other gold plating layers 170' are formed in openings C having the patterns of the lower solder resist 160' of the base plate 100, that is, the solder ball pad.

In this case, the gold plating layers 170 and 170' are formed through the following process. The base plate 100 is submerged in a gold plating container, and then an electrolytic gold plating process is performed using a DC rectifier, thus forming the gold plating layers 170 and 170'. Preferably, an area to be plated is calculated, and a proper amount of current is applied to the DC rectifier in response to the calculated area, thus depositing gold.

Further, in order to increase a coupling force with the gold, it is preferable that nickel be thinly plated, and then the gold plating layers 170 and 170' be formed.

Subsequently, a profile of the base plate is formed using a router or a power press.

Next, a semiconductor chip 500 is mounted on the board using an adhesive 400, and bonded wires 180 and the solder balls 190 are formed. Thereby, as shown in FIG. 4, a CSP is obtained.

In the BGA package board shown in FIG. 4, the solder balls 190 are further corroded on a surface of the solder resist 160', in a direction of the solder ball pads, due to the solder ball pads which are partially etched.

When the same amount of solder balls 190 are formed on the solder ball pad, the corrosion of the solder balls 190 prevents the solder balls 190 from adhering to each other even when a pitch between the solder balls 190 is small, that is, 0.5 mm or less (see the circles D defined with dotted lines in FIG. 4).

Further, when the solder ball pads are formed using fewer solder balls 190, the BGA package board of the present invention is advantageous in that a distance between a surface of a solder ball 190 and a surface of another solder ball 190 is longer, compared to the conventional BGA package board, thus allowing the pitch between the solder balls 190 to be small.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

As described above, the present invention provides a BGA package board and a manufacturing method thereof, which reduce a thickness of solder ball pads through a partial etching process, thus preventing solder balls from adhering to each other.

Therefore, the BGA package board and the manufacturing method thereof according to this invention increase a distance between solder balls, thus preventing the solder balls from adhering to each other even when a pitch between the solder balls is 0.5 mm or less.

Further, the BGA package board and the manufacturing method thereof according to this invention prevent the solder balls from adhering to each other, thus enhancing reliability of a final electronic product.

Furthermore, the BGA package board and the manufacturing method thereof according to this invention can achieve a fine solder ball pattern, thus being suitable for electronic products which are characterized by miniaturization, high integration, and multi-functionality.

What is claimed is:

1. A method of manufacturing the BGA package board, comprising:
   (A) providing a base plate including a first external layer, a second external layer, and an insulating layer provided between the first and second external layers;
   (B) forming a pattern including a circuit pattern and a wire bonding pattern on the first external layer, and forming a pattern including a circuit pattern and a solder ball pad pattern on the second external layer;
   (C) coating a solder resist on each of the first and second external layers, and forming a solder resist pattern which is opened at portions corresponding to the wire bonding pad pattern and the solder ball pad pattern; and
   (D) partially etching the solder ball pad pattern of the second external layer;
   wherein the solder ball pad pattern is composed of a partially etched portion of an originally formed pattern of the second external layer, and the circuit pattern of the second external layer is composed of the originally formed pattern of the second external layer resulting in the solder ball pad pattern having a reduced thickness as compared with the circuit pattern of the second external layer.

2. The method according to claim 1, further comprising:
   (E) forming a first outer via hole on the base plate, after the (A) step of providing the base plate; and
   (F) forming a copper plating layer on each of the first and second external layers of the base plate and sidewalls of the first outer via hole.

3. The method according to claim 1, further comprising:
   (E) forming a nickel plating layer on each of the wire bonding pattern and the solder ball pad pattern, after the (D) step of partially etching the solder ball pad pattern of the second external layer;
   (F) forming a gold plating layer on the nickel plating layer formed on each of the wire bonding pad pattern and the solder ball pad pattern; and
   (G) forming solder balls on the gold plating layer with the solder ball pad pattern.

4. The method according to claim 1, wherein the (D) step of partially etching the solder ball pad pattern of the second external layer comprises:
   (D-1) coating an etching resist on the solder resist of the second external layer, and exposing and developing the etching resist, thus forming an etching resist pattern so that a portion corresponding to the solder ball pad pattern is opened;
   (D-2) partially etching the solder ball pad pattern, using the etching resist pattern; and
   (D-3) removing the etching resist.

5. The method according to claim 4, wherein the (D-2) step of partially etching the solder ball pad pattern comprises:
   partially etching the solder ball pad pattern using a wet etching method including a spray etching method.

6. The method according to claim 4, wherein the (D-2) step of partially etching the solder ball pad pattern comprises:
   partially etching the solder ball pad pattern using a dry etching method including a plasma etching method.

7. The method according to claim 4, wherein the etching resist comprises a photo resist material.

8. The method according to claim 1, wherein the base plate comprises:
   an internal layer formed in the insulating layer, and comprising:
   a plurality of circuit layers with a circuit pattern;

a plurality of insulating resin layers formed between the circuit layers; and inner via holes to electrically connect the circuit layers to each other; and a second outer via hole to electrically connect the external layers to the circuit layers of the internal layer.

9. A method of manufacturing the BGA package board, comprising:
- (A) providing a base plate including a first external layer, a second external layer, and an insulating layer provided between the first and second external layers;
- (B) forming a pattern including a circuit pattern and a wire bonding pattern on the first external layer, and forming a pattern including a circuit pattern and a solder ball pad pattern on the second external layer;
- (C) coating a solder resist on each of the first and second external layers, and forming a solder resist pattern which is opened at portions corresponding to the wire bonding pad pattern and the solder ball pad pattern;
- (D) partially etching the solder ball pad pattern of the second external layer;
- (E) forming a nickel plating layer on each of the wire bonding pattern and the solder ball pad pattern, after the (D) step of partially etching the solder ball pad pattern of the second external layer;
- (F) forming a gold plating layer on the nickel plating layer formed on each of the wire bonding pad pattern and the solder ball pad pattern; and
- (G) forming solder balls on the gold plating layer with the solder ball pad pattern.

10. The method according to claim 9, wherein the (D) step of partially etching the solder ball pad pattern of the second external layer comprises:
- (D-1) coating an etching resist on the solder resist of the second external layer, and exposing and developing the etching resist, thus forming an etching resist pattern so that a portion corresponding to the solder ball pad pattern is opened;
- (D-2) partially etching the solder ball pad pattern, using the etching resist pattern; and
- (D-3) removing the etching resist.

11. The method according to claim 10, wherein the (D-2) step of partially etching the solder ball pad pattern comprises:
partially etching the solder ball pad pattern using a wet etching method including a spray etching method.

12. The method according to claim 10, wherein the (D-2) step of partially etching the solder ball pad pattern comprises:
partially etching the solder ball pad pattern using a dry etching method including a plasma etching method.

13. The method according to claim 10, wherein the etching resist comprises a photo resist material.

14. A method of manufacturing the BGA package board, comprising:
- (A) providing a base plate including a first external layer, a second external layer, and an insulating layer provided between the first and second external layers;
- (B) forming a pattern including a circuit pattern and a wire bonding pattern on the first external layer, and forming a pattern including a circuit pattern and a solder ball pad pattern on the second external layer;
- (C) coating a solder resist on each of the first and second external layers, and forming a solder resist pattern which is opened at portions corresponding to the wire bonding pad pattern and the solder ball pad pattern; and
- (D) partially etching the solder ball pad pattern of the second external layer;

wherein the (D) step of partially etching the solder ball pad pattern of the second external layer comprises:
- (D-1) coating an etching resist on the solder resist of the second external layer, and exposing and developing the etching resist, thus forming an etching resist pattern so that a portion corresponding to the solder ball pad pattern is opened;
- (D-2) partially etching the solder ball pad pattern, using the etching resist pattern; and
- (D-3) removing the etching resist.

15. The method according to claim 14, wherein the (D-2) step of partially etching the solder ball pad pattern comprises:
partially etching the solder ball pad pattern using a wet etching method including a spray etching method.

16. The method according to claim 14, wherein the (D-2) step of partially etching the solder ball pad pattern comprises:
partially etching the solder ball pad pattern using a dry etching method including a plasma etching method.

17. The method according to claim 14, wherein the etching resist comprises a photo resist material.

* * * * *